United States Patent [19]
Katsumata

[11] 4,438,409
[45] Mar. 20, 1984

[54] ACTIVE EQUALIZER

[75] Inventor: Yasushi Katsumata, Tokyo, Japan

[73] Assignee: Sony Corporation, Tokyo, Japan

[21] Appl. No.: 350,334

[22] Filed: Feb. 19, 1982

[30] Foreign Application Priority Data

Feb. 27, 1981 [JP] Japan .................................. 56-27793

[51] Int. Cl.³ .............................................. H03F 1/34
[52] U.S. Cl. .................................... 330/107; 330/110;
330/126; 333/28 T
[58] Field of Search ............... 330/107, 109, 126, 110,
330/51, 304; 333/28 R, 28 T

[56] References Cited

FOREIGN PATENT DOCUMENTS

| | | |
|---|---|---|
| 1246634 | 9/1971 | United Kingdom . |
| 1297058 | 11/1972 | United Kingdom . |
| 1345200 | 1/1974 | United Kingdom . |
| 1452920 | 10/1976 | United Kingdom . |
| 1454617 | 11/1976 | United Kingdom . |

*Primary Examiner*—James B. Mullins
*Assistant Examiner*—Steven J. Mottola
*Attorney, Agent, or Firm*—Lewis H. Eslinger; Alvin Sinderbrand

[57] ABSTRACT

In an active equalizer for selectively boosting or attenuating predetermined frequencies of audio or other electrical signals, and which comprises an inverting amplifier having an inverting input which receives the input signal through an input resistance and an output connected with the inverting input through a feedback resistance and at which the equalized output is derived, and an active filter for determining the frequencies to be boosted or attenuated; there is further provided a change-over switch having a boosting position in which the input signal is applied to the active filter, an attenuating position in which the output of the inverting filter is applied to the active filter and a neutral position, and a potentiometer connected between the output of the active filter and the inverting input of the inverting amplifier and being operable in concert with the change-over switch for determining the extent to which the frequencies determined by the active filter are boosted or attenuated.

9 Claims, 5 Drawing Figures

ACTIVE EQUALIZER

BACKGROUND OF THE INVENTION

1. Field of the Invention

The present invention relates generally to an active equalizer, and more particularly to an active equalizer by which a signal within a selected frequency range can be either boosted or attenuated with an improved signal-to-noise ratio.

2. Description of the Prior Art

A known active equalizer is shown in FIG. 1 to include a potentiometer 3 having a grounded center tap, with one end of its resistance element being connected to an input terminal $T_1$ and the other end of the resistance element being connected to an output terminal $T_2$. An inverting amplifier 4 has an inverting input terminal connected through a first or input resistor 1 to signal input terminal $T_1$, and an output terminal connected to signal output terminal $T_2$. The non-inverting input terminal of inverting amplifier 4 is connected to a source of a reference potential, or to ground. A second feedback resistor 2 is inserted between the inverting input terminal and the output terminal of inverting amplifier 4. The known active equalizer also includes a transfer impedance circuit 5, which is shown to be an active filter, whose input terminal is connected to the wiper of potentiometer 3, and whose output terminal is connected to the inverting input terminal of inverting amplifier 4 through resistor 6.

In the active equalizer shown in FIG. 1, when the wiper of potentiometer 3 engages the resistance element thereof at its center tap, the active filter 5 is, in effect, disconnected from the circuit, and the frequency response of the active equalizer becomes flat. When the wiper is moved along the resistance element of potentiometer 3 toward input terminal $T_1$, the range of frequencies of the input signal determined by filter 5 is boosted by the active equalizer, and when the wiper moves towards output terminal $T_2$, such frequency range of the input signal is attenuated. It is also known in the prior art that, by selected first and second resistors 1 and 2 to have equal resistance values, the gain of inverting amplifier 4 can be made to be unity.

In practice, an active equalizer of the type generally shown in FIG. 1 is arranged as shown in FIG. 2, and in which a plurality of sub-circuits comprised of potentiometers 3A, 3B, 3C, ..., active filters 5A, 5B, 5C, ..., and resistors 6A, 6B, 6C, ..., respectively, are connected in parallel in conjunction with a common first resistor 1, second resistor 2 and inverting amplifier 4 to form the active equalizer circuit.

In the prior art active equalizer shown in FIG. 1, and in which potentiometer 3 is disposed at the input side of active filter 5, any noise generated by an active element in active filter 5, such as a transistor or the like, is applied to inverting amplifier 4 with a constant level, regardless of the level of the input signal received by active filter 5. Therefore, the signal-to-noise ratio of the signal received at the inverting input terminal of inverting amplifier 4 deteriorates as the level of the input signal to active filter 5 is reduced.

In the case of the prior art active equalizer shown in FIG. 2, it is possible that an input signal may be applied through only some, and not all of active filters 5A, 5B, 5C. However, the noise produced by all of the active filters 5A, 5B, 5C, ..., is nevertheless supplied to the input terminal of inverting amplifier 4, and cumulated. As a result, as the number of active filters in such an arrangement increases, the signal-to-noise ratio of the input signal provided to inverting amplifier 4 may deteriorate accordingly.

OBJECTS AND SUMMARY OF THE INVENTION

Accordingly, an object of the present invention is to provide an active equalizer which is free from the above-described defects of the prior art devices.

Another object of the invention is to provide an active equalizer in which the signal-to-noise ratio of the signal provided to an inverting amplifier therein remains constant regardless of the level or frequency of the input signal to an active filter.

According to an aspect of the present invention, there is provided an active equalizer for selectively increasing and decreasing to a desired degree the amplitude of selected frequencies of an input signal, comprising: an input terminal for receiving the input signal and an output terminal for supplying an actively equalized output signal; inverting means having an inverting input connected through an input resistance to the input terminal, and an output connected to said output terminal; a feedback resistance connected between the output and inverting input of the inverting means; active filter means responsive to said selected frequencies and having at least one filter output and at least one filter input; means for selectively connecting each said filter input to said input terminal for increasing said amplitude, and to said output terminal for decreasing said amplitude; and variable resistance means connecting each said filter output to said inverting input for varying said degree to which said amplitude is selectively increased or decreased.

The above, and other objects, features and advantages of the present invention, will become apparent from the following detailed description which is to be read in conjunction with the accompanying drawings, in which like reference numerals designate the same elements and parts in the several views.

DESCRIPTION OF THE PREFERRED EMBODIMENTS

Figure 1:
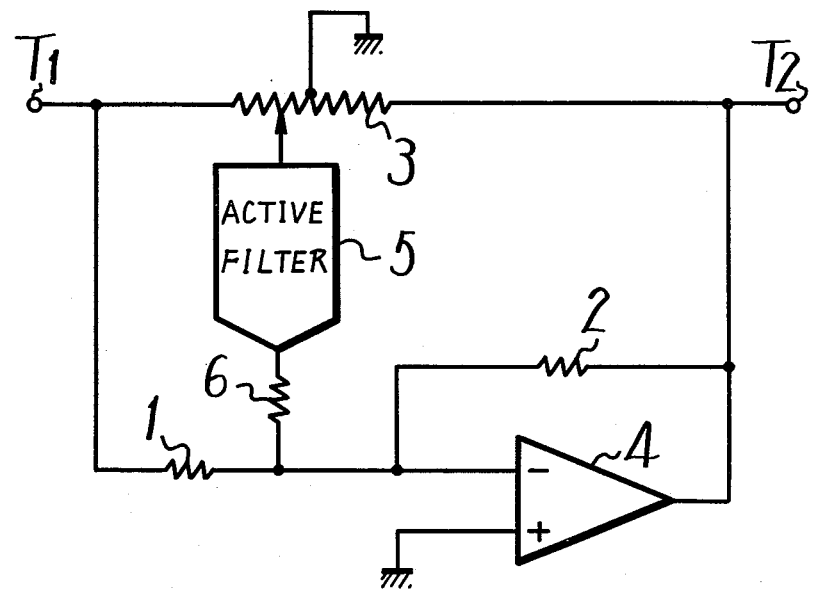
FIGS. 1 and 2 are circuit diagrams showing prior art active equalizers.
Figure 2:
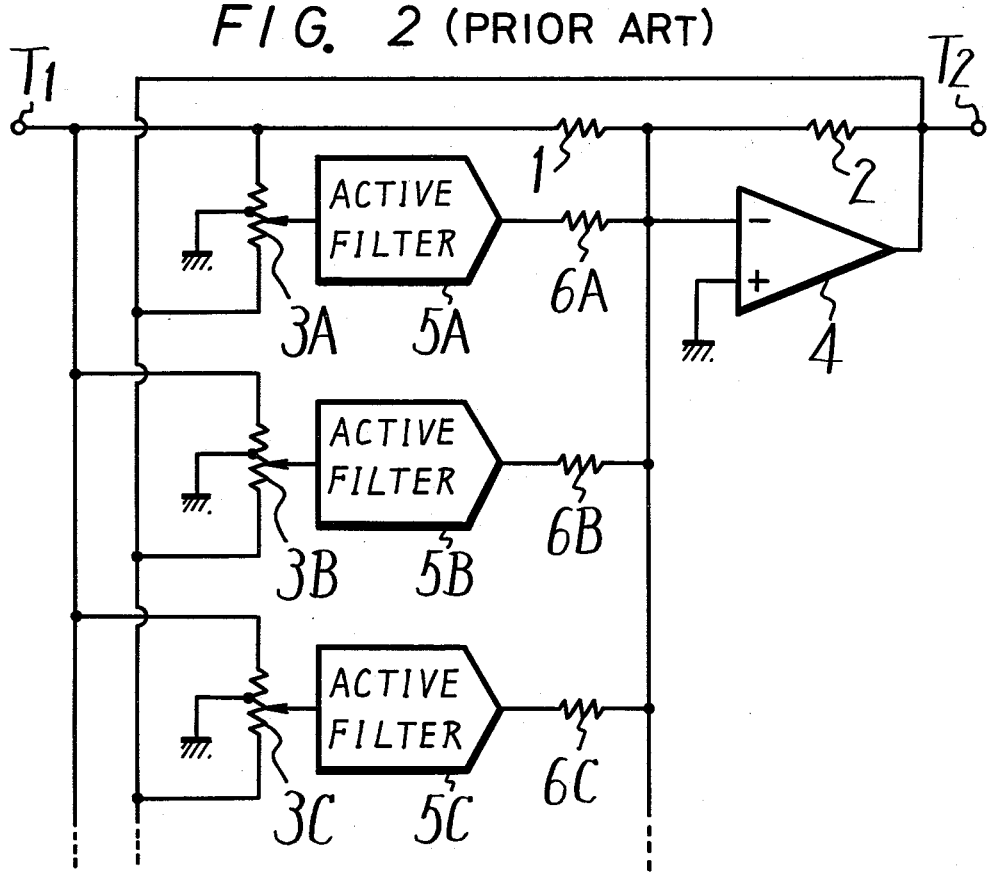

A first embodiment of the invention will be described with reference to FIG. 3, in which parts and elements corresponding generally to those in FIG. 1 are designated by the same reference numerals.

Figure 3:
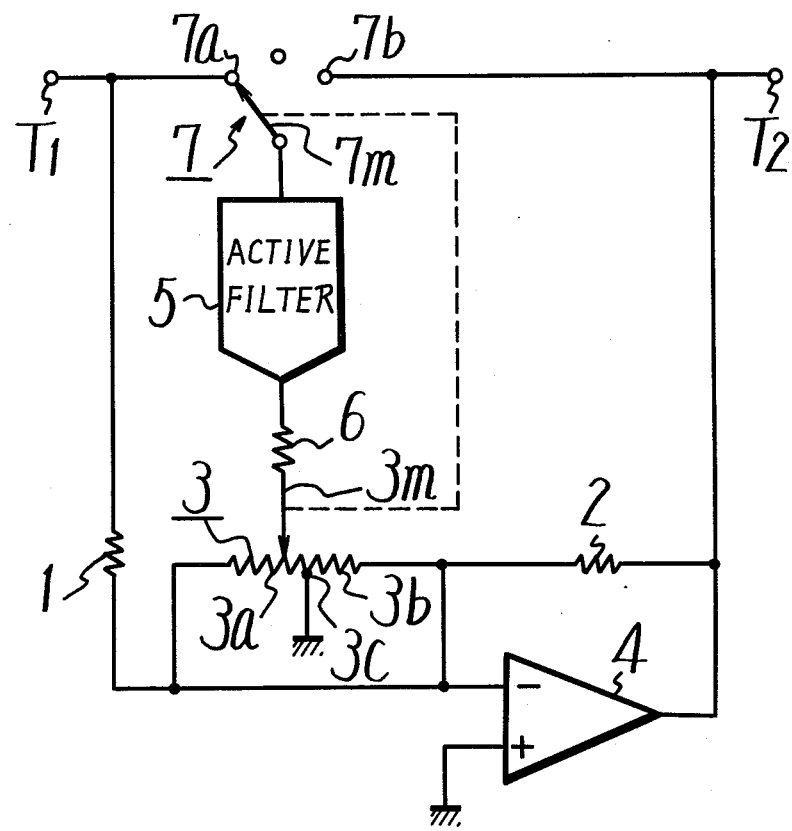
FIG. 3 is a circuit diagram showing an active equalizer according to an embodiment of the present invention.

In the active equalizer of FIG. 3, a first or input resistor 11 is connected between a signal input terminal $T_1$ and a first resistive member of portion 3a of the resistance element of a potentiometer 3. A center tap 3c of the potentiometer 3 is connected to a source of a reference potential for example, to ground. A second resistive member or portion 3b of the resistance element is connected to the signal output terminal $T_2$ through a second or feedback resistor 2, whose resistance value may usefully be the same as that of the first resistor 1. Both resistive members or portions 3a and 3b are also connected together and to an inverting input of an inverting amplifier 4, whose non-inverting input is connected to a source of a reference potential, for example, to ground, and whose output is connected to output terminal $T_2$. The potentiometer 3 is completed by a wiper 3m which is movable to selectively contact resistive members 3a and 3b and the center tap 3c therebetween.

There is also provided a switch 7, which includes a movable contact 7m and first and second fixed contacts 7a and 7b. The movable contact 7m is ganged with wiper 3m of potentiometer 3. The first and second fixed contacts 7a and 7b are respectively connected to the signal input and output terminals $T_1$ and $T_2$. A transfer impedance circuit 5 which, in this embodiment, is an active filter, is connected at its input to the movable contact 7m of switch 7, while the output of active filter 5 is connected to wiper 3m of potentiometer 3 through a resistor 6.

Practical examples of the construction of potentiometer 3 and switch 7 will now be described with reference to FIG. 4. In that figure, the center tap of potentiometer 3 is seen to be constituted by an arcuate conductor 3c. This center tap subtends an angle of $\beta$ with respect to its center of curvature. The resistive members 3a and 3b are shown to be arcuate and symmetrically located at opposite sides of the center tap 3c. The members 3a and 3b are connected, at one end, to center tap 3c and are selectively engaged by wiper 3m, which is in slidable contact with members 3a and 3b as well as center tap 3c. As seen in FIG. 3, resistive members 3a and 3b are connected, at their other ends, to first and second resistors 1 and 2, respectively, and to each other for connection to the inverting input of amplifier 4.

Figure 4:
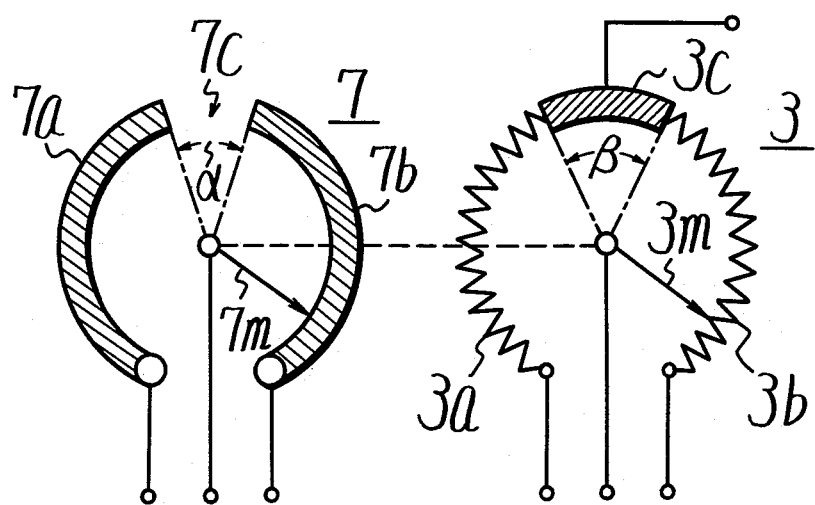
FIG. 4 is a simplified representation of a practical construction of certain components of the active equalizer shown in FIG. 3.

As also shown in FIG. 4, in switch 7, fixed contacts 7a and 7b are arcuate and disposed in a generally circular arrangement. Between contacts 7a and 7b is a gap 7c subtending an angle of $\alpha$ with respect to the center of curvature of contacts 7a and 7b, which angle $\alpha$ is less than the angle $\beta$. Movable contact 7m rotates about said center of curvature, and is in selective sliding engagement with fixed contacts 7a and 7b.

The overall angle subtended by members 3a and 3b and center tap 3c of potentiometer 3 is selected to be substantially equal to the overall angle subtended by contacts 7a and 7b and gap 7c of switch 7. Wiper 3m and movable contact 7m are ganged together, for example, by shaft means represented in the figures by a dashed line, such that they are always in the same angular position with respect to a line passing through the centers of curvature of the elements of the potentiometer and switch. Thus, whenever movable contact 7m is located in gap 7c, wiper 3m is in engagement with center tap 3c for grounding the output of filter 5. On the other hand when wiper 3m engages the first or second resistive member 3a or 3b, movable contact 7m is in engagement with first or second contact 7a or 7b, respectively.

The operation of the active equalizer according to the embodiment of the invention described above will now be described.

(A) When movable contact 7m of switch 7 engages fixed contact 7a and wiper 3m of potentiometer 3 engages first resistive member 3a, the input signal from terminal $T_1$ and the resulting output of active filter 5 are added together and supplied as the input to the inverting input of amplifier 4. In this case, the result is a boosting of the amplitude of the input signal for those frequencies thereof determined by filter 5. As wiper 3m is moved to the end of member 3a away from center tap 3c, the boosting effect is increased, and, when the wiper is moved in the direction toward center tap 3c, the boosting is diminished.

(B) When movable contact 7m of switch 7 is located in gap 7c, and wiper 3m is in engagement with center tap 3c, the active filter 5 is effectively disconnected from the circuit and the frequency response of the latter becomes flat.

(C) When movable contact 7m of switch 7 engages fixed contact 7b and wiper 3m engages second resistive member 3b, the output signal at output terminal $T_2$ is received as the input to active filter 5 and fed back through the latter to inverting input of amplifier 4, the effect being an attenuation of selected frequencies of the input signal received at terminal $T_1$. As wiper 3m approaches the end of member 3b away from center tap 3c, the attenuating effect is increased, and, when the wiper is moved toward center tap 3c, the attenuation is reduced.

A functional analysis of the operation of the above-described active equalizer according to this invention will now be set forth. In this analysis, $V_{in}$ represents the input signal voltage applied to input terminal $T_1$, and $V_{out}$ represents the output signal voltage appearing at output terminal $T_2$. The resistance values of input and feedback resistors 1 and 2 are both designated R, and the resistance value of resistor 6 is designated $R_T$. K designates a voltage dividing ratio determined by the setting of potentiometer 3, and has a value of from 0 to 1. The transfer function of active filter 5 is $F(\omega)$, where $\omega$ is the angular frequency.

The transfer function $V_{out}/V_{in}$ in the situations discussed at (A), (B) and (C) above can be expressed by equations (1), (2) and (3), respectively, as follows:

$$\frac{V_{out}}{V_{in}} = -[1 + K \cdot \frac{R}{R_T} \cdot F(\omega)] \quad (1)$$

$$\frac{V_{out}}{V_{in}} = -1 \quad (2)$$

$$\frac{V_{out}}{V_{in}} = -\frac{1}{1 + K \cdot \frac{R}{R_T} \cdot F(\omega)} \quad (3)$$

For equation (1), the ratio K is assumed to approach the value 1 when the wiper 3m nears the end of member 3a away from center tap 3c, while K nears 0 as the wiper approaches the center tap. Similarly, for equation (3), when wiper 3m is in contact with end member 3b away from center tap 3c, K is at its maximum value 1 and, as the wiper approaches the center tap, K again approaches 0.

Figure 5:
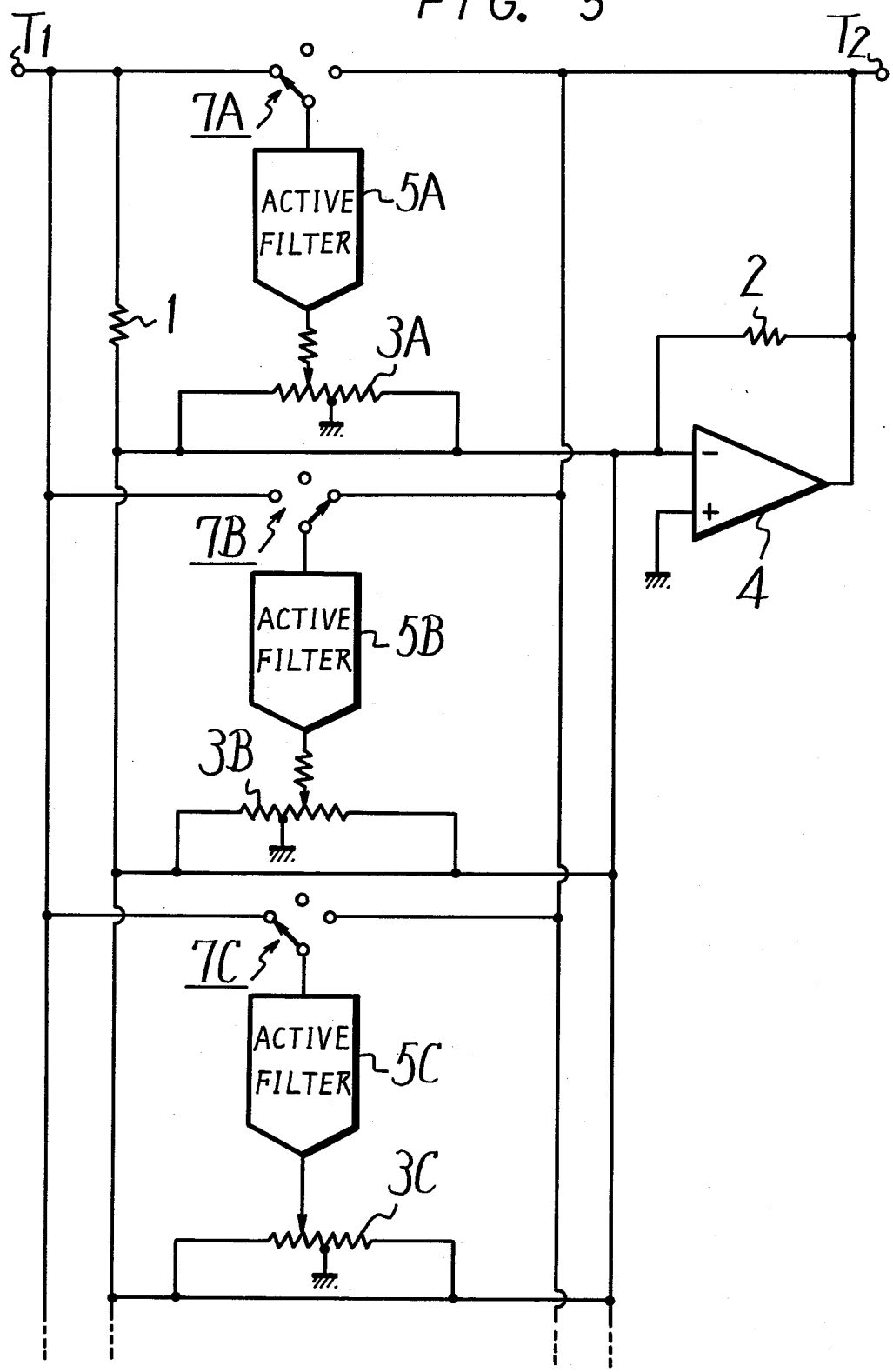
FIG. 5 is a circuit diagram showing an active equalizer according to another embodiment of the invention.

Another embodiment of an active equalizer according to this invention is shown in FIG. 5, in which a plurality of sub-circuits comprised of potentiometers 3A, 3B, 3C, . . . , active filters 5A, 5B, 5C, . . . , and switches 7A, 7B, 7C, . . . , respectively, connected with each other in the same manner as the correspondingly numbered parts on FIG. 3, in conjunction with a common first resistor 1, a second resistor 2, and an inverting amplifier 4 in a fashion analogous to that described previously with references to FIG. 3. The potentiometer and switch of each such sub-circuit, for example, the potentiometer and switch 3A and 7A, are ganged for simultaneous adjustment as set forth above. Further, the frequency response of each of the plurality of active filters 5A, 5B, 5C, ..., may be either the same or different from the frequency response of the other active filters.

In each active equalizer according to the described embodiments, and in which each potentiometer is located between the output of an active filter and the inverting input to the amplifier, any noise generated by an active element in the active filter, such as a transistor or the like, is diminished by the respective potentiometer in the same proportion as the desired signal. Thus, the signal-to-noise ratio remains constant and may be optimized without risk of later deterioration when a weak signal is the input to the equalizer.

When a plurality of active filters present, as shown in FIG. 5, the foregoing desirable characteristic is particularly advantageous. In addition, if the movable contact of 7, 7A, 7B or 7C switch is located in the gap of that switch, then the wiper of the respective potentiometer 3, 3A, 3B, 3C engages the center tap, thus grounding the output of the respective active filter 5, 5A, 5B, 5C. Thus, even if no input signal is being supplied to a given active filter, no noise is introduced from that filter to the input of the inverting amplifier, eliminating any risk that the signal-to-noise ratio of the input signal to the inverting amplifier will be deteriorated by an increase in the number of active filters included in the equalizer and some of which may not be supplying an input signal at a given time.

In the embodiments of the invention, the potentiometers 3, 3A, 3B, 3C and switches 7, 7A, 7B, 7C have been described in mechanical terms, for example, as rotary devices. It is of course possible, however, that they may be of a linear type, or be constituted by electronic components in whole or in part.

Although illustrative embodiments of this invention have been described in detail herein with reference to the accompanying drawings, it is to be understood that the invention is not limited to these precise embodiments, and that various changes and modifications may be effected therein by one skilled in the art without departing from the spirit and scope of the invention, as defined in the appended claims.

What is claimed is:

1. An active equalizer for selectively increasing and decreasing to a desired degree the amplitude of selected frequencies of an input signal, comprising:
an input terminal for receiving said input signal and an output terminal for providing an equalized output;
an input resistance;
inverting means having an inverting input connected to said input terminal through said input resistance and an output connected to said output terminal;
a feedback resistance connected between said inverting input and output of said inverting means;
active filter means responsive to said selected frequencies and having at least one filter output and at least one filter input;
means for selectively connecting each said filter input to said input terminal for increasing said amplitude, and to said output terminal for decreasing said amplitude; and
variable resistance means connecting each said filter output to said inverting input for varying said degree to which said amplitude is selectively increased and decreased.

2. An active equalizer as in claim 1; wherein
said active filter means includes a plurality of active filters each having a filter output and a filter input, said filters being responsive to signals in respective frequency ranges; and
said variable resistance means includes a plurality of potentiometers respectively corresponding to said plurality of active filters, each said potentiometer including a resistance element having first and second ends and a center tap for connection to a source of a reference potential, a wiper connected to said filter output of a respective one of said plurality of filters and engaging said resistance element, said first and second ends of the resistance element being both connected to said inverting input.

3. An active equalizer as in claim 1; wherein the resistance values of said input and feedback resistances, respectively, are substantially equal.

4. An active equalizer as in claim 1; wherein said variable resistance means comprises a potentiometer including a resistance element having first and second ends and a center tap for connection to a source of a reference potential, and a wiper connected to said filter output and engaging said resistance element, said first and second ends being both connected to said inverting input.

5. An active equalizer as in claim 4; wherein said means for selectively connecting said filter input to said input and output terminals comprises switch means having first and second fixed contacts respectively connected to said input and output terminals, and a movable contact connected to said filter input and movable selectively to first and second positions for engagement with said first and second fixed contacts, respectively, and to an intermediate position therebetween.

6. An active equalizer as in claim 5; wherein said potentiometer and said switch means are ganged so that said wiper of said potentiometer contacts said center tap at least when said movable contact of the switch means is in said intermediate position.

7. An active equalizer as in claim 6; wherein
said first and second fixed contacts of said switch means comprise circularly arcuate conductors having a gap therebetween, said movable contact being radially disposed in respect to the center of curvature of said conductors; and
said resistance element is also circularly arcuate and concentric with said conductors, said wiper being radially disposed between said resistance element and said center, and said center tap subtending an angle with respect to said center at least as great as an angle subtended by said gap; and
further comprising means to which said wiper and said movable contact are attached for movement in fixed angular relationship with each other.

8. An active equalizer for selectively increasing and decreasing to a desired degree the amplitude of selected frequencies of an input signal comprising:
an input terminal for receiving said input signal and an output terminal for supplying an equalized output signal;
an input resistance;
an inverting amplifier having an inverting input connected through said input resistance to said input terminal, a second input terminal for connection to a source of a reference potential, and an inverting output connected to said output terminal;

a feedback resistance connected between said inverting input and output of said amplifier;

at least one switch having first and second fixed contacts respectively connected to said input and output terminals, and a movable contact which is selectively movable to first and second positions for engagement with said first and second fixed contacts, respectively, and to an intermediate position therebetween;

an active filter for each said switch and being responsive to signals having said selected frequencies, each said filter having a filter input and a filter output, each said filter input being connected to a movable contact of the respective switch, said movable contact engaging said first fixed contact of said switch for increasing said amplitude, and engaging said second fixed contact for decreasing said amplitude; and a potentiometer for each said active filter and including a resistance element having first and second ends and a center tap for connection to a source of a reference potential, and a wiper engaging said resistance element and connected to said filter output of the respective active filter, said first and second ends of the resistance element being both connected to said inverting input;

said first and second fixed contacts of each said switch comprising circularly arcuate conductors having a gap therebetween, said movable contact being radially disposed in respect to the center of curvature of said conductors; and said resistance element of each said potentiometer also being circularly arcuate and concentric with said conductors, said wiper being radially disposed about said center and engaging said resistance element, and said center tap subtending an angle with respect to said center at least as great as an angle subtended by said gap; and means connecting said wiper of each said potentiometer and said movable contact of the respective switch for movement in fixed angular relationship to each other, such that said wiper engages said center tap at least when said movable contact is in said intermediate position.

9. An active equalizer as in claim 8, wherein the resistance values of said input and feedback resistances respectively, are substantially equal.

* * * * *